United States Patent
Thakur et al.

(10) Patent No.: US 6,251,720 B1
(45) Date of Patent: *Jun. 26, 2001

(54) HIGH PRESSURE REOXIDATION/ANNEAL OF HIGH DIELECTRIC CONSTANT MATERIALS

(76) Inventors: Randhir P. S. Thakur, 3545 S. Bridgeporte Pl.; Scott Jeffrey DeBoer, 259 E. Twin Willow, both of Boise, ID (US) 83706

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/720,375

(22) Filed: Sep. 27, 1996

(51) Int. Cl.[7] ............................................. H01L 21/8242
(52) U.S. Cl. ............................................. 438/240; 483/3
(58) Field of Search ............................ 438/3, 240, 243, 438/253, 254, 255, 386, 396, 397, 398

(56) References Cited

U.S. PATENT DOCUMENTS

| | | | |
|---|---|---|---|
| 4,495,219 | 1/1985 | Kato et al. | 427/82 |
| 5,079,191 | 1/1992 | Shinriki et al. | 437/235 |
| 5,111,355 | 5/1992 | Anand et al. | 361/313 |
| 5,142,438 | 8/1992 | Reinberg et al. | 361/313 |
| 5,198,269 | 3/1993 | Swartz et al. | 427/226 |
| 5,202,280 | 4/1993 | Kamiyama et al. | 437/47 |
| 5,336,638 | 8/1994 | Suzuki et al. | 437/190 |
| 5,374,578 * | 12/1994 | Patel et al. | 438/3 |
| 5,396,094 | 3/1995 | Matsuo | 257/310 |
| 5,438,012 | 8/1995 | Kamiyama | 437/60 |
| 5,444,006 | 8/1995 | Han et al. | 437/60 |
| 5,459,345 | 10/1995 | Okudaira et al. | 257/310 |
| 5,471,364 | 11/1995 | Summerfelt et al. | 361/321.4 |
| 5,478,772 | 12/1995 | Fazan | 437/60 |
| 5,489,548 | 2/1996 | Nishioka et al. | 437/60 |
| 5,506,166 | 4/1996 | Sandhu et al. | 437/60 |
| 5,508,881 | 4/1996 | Stevens | 361/305 |
| 5,519,238 | 5/1996 | Lu | 257/309 |
| 5,552,337 | 9/1996 | Kwon et al. | 437/60 |

(List continued on next page.)

OTHER PUBLICATIONS

Tomonori Aoyama, et al., "Leakage Current Mechanism of Amorphous and Polycrystalline $Ta_2O_5$ Films Grown by Chemical Vapor Deposition", *J. Electrochem. Soc.*, vol. 143, No. 3, pp. 977–983, (Mar. 1996).

P. C. Fazan, et al., "A High–C Capacitor (20.4 fF/$\mu m^2$) with Ultrathin CVD—Ta205 Films Deposited on Rugged Poly–Si for High Density DRAMs", *IEEE*, pp. 263–266, (1992).

P. C. Fazan, et al., "Ultrathin $Ta_2O_5$ Films on Rapid Thermal Nitrided Rugged Polysilicon for High Density DRAMs", International Confernece on Solid State Devices and Materials, Extended Abstracts, pp. 697–698, (1992).

(List continued on next page.)

*Primary Examiner*—Carl Whitehead, Jr.
*Assistant Examiner*—Toniae M. Thomas
(74) *Attorney, Agent, or Firm*—Schwegman, Lundberg, Woessner & Kluth, P.A.

(57) ABSTRACT

A high dielectric constant (HDC) capacitive dielectric film is fabricated in a capacitor structure using relatively high pressure surface treatments. After forming the HDC capacitive dielectric film on a supporting bottom plate electrode structure, a surface treatment comprising oxidation, at a pressure of at least approximately one atmosphere and temperatures of approximately at least 200 degrees Celsius densifies/conditions the HDC capacitive dielectric film. When using a polysilicon, crystalline silicon, hemispherical grain polysilicon, germanium, or silicon-germanium bottom plate electrode, a relatively high pressure surface treatment, comprising rapid thermal nitridation or oxidation, is used after forming the bottom plate electrode, forming a diffusion barrier layer in a controlled manner.

51 Claims, 9 Drawing Sheets

U.S. PATENT DOCUMENTS

| | | | |
|---|---|---|---|
| 5,554,564 | 9/1996 | Nishioka et al. | 437/192 |
| 5,554,866 | 9/1996 | Nishioka et al. | 257/295 |
| 5,555,486 | 9/1996 | Kingon et al. | 361/305 |
| 5,585,300 | * 12/1996 | Summerfelt | 438/240 |
| 5,617,290 | 4/1997 | Kulwicki et al. | 361/321.4 |
| 5,624,865 | 4/1997 | Schuegraf et al. | 438/396 |
| 5,626,906 | 5/1997 | Summerfelt et al. | 427/126.3 |
| 5,654,222 | * 8/1997 | Sandhu et al. | 438/240 |
| 5,677,226 | 10/1997 | Ishitani | 437/60 |
| 5,763,300 | 6/1998 | Park et al. | 438/240 |
| 5,786,248 | 7/1998 | Schuegraf | 438/240 |

OTHER PUBLICATIONS

Satoshi Kamiyama, et al., "Characterization of Ultra–Thin Capacitors Fabricated Using RTN Treatment Prior to CVD $Ta_2O_5$ Film Formation", International Conference on Solid State Devices and Materials, Extended Abstracts, pp. 521–523, (1992).*

Satoshi Kamiyama, et al., "Highly Reliable 2.5nm Ta2O5 Capacitor Process Technology for 256Mbit DRAMs", *IEEE*, pp. 827–830, (1991).*

H. K. Kang, et al., "Highly Manufacturable Process Technology for Reliable 256 Mbit and 1Gbit DRAMs", *IEEE*, pp. 635–638, (1994).*

Shin–ichiro Kimura, et al., "Leakage–Current Increase in Amorphous $Ta_2O_5$ Films Due to Pinhole Growth during Annealing Below 600° C.", *J. Electrochem. Society*, vol. 130, No. 12, pp. 2414–2418, (Dec. 1983).*

K. W. Kwon, et al., "$Ta_2O_5$ Capacitors for 1 Gbit DRAM and Beyond", *IEEE*, pp. 835–842, (1994).*

Sudhir K. Madan, "DRAM Plate Electrode Bias Optimization for Reducing Leakage Current in UV–$O_3$ and $O_2$ Annealed CVD Deposited $Ta_2O_5$ Dielectric Films", *IEEE*, Transactions on Electronic Devices, vol. 42, No. 10, pp. 1871–1873, (Oct. 1995).*

V. K. Mathews, et al., "Electronic Characterization of RTN–Poly–Si/CVD–$Ta_2O_5$/CVD–TiN Stacked DRAM Capacitors", International Conference on Solid State Devices and Materials, Extended Abstracts, pp. 856–858, (1993).*

Hideaki Matsuhashi, et al., "Optimum Electrode Materials for $Ta_2O_5$ Capacitors at High and Low Temperature Process", International Conference on Solid State Devices and Materials, Extended Abstracts, pp. 853–855, (1993).*

P. A. Murawala, et al., "Plasma Enhanced Liquid Source–CVD of $Ta_2O_5$ Using Penta Ethoxy Tantalum Source and Its Characteristics", *Materials Research Society*, vol. 265, pp. 319–324, (1992).*

Y. Numasawa, et al., "$Ta_2O_5$ Plasma CVD Technology for DRAM Stacked Capacitors", *IEEE*, pp. 43–46, (1989).*

M. Saitoh, et al., "Electrical Properties of Thin $Ta_2O_5$ Films Grown by Chemical Vapor Deposition", *IEEE*, pp. 680–683, (1986).

Kamiyama Satoshi, et al., "Ultrathin Tantalum Oxide Capacitor Dielectric Layers Fabricated Using Rapid Thermal Nitridation prior to Low Pressure Chemical Vapor Deposition", *J. Electrochem Soc.*, vol. 140, No. 6, pp. 1617–1625, (1993).

O. Shin–ichi, et al., "Oxidation of hydrogen doped tantalum films on Silicon", *J. Vac. Sci. Technol. B.*, vol. 4, No. 3, pp. 713–716, (May/Jun. 1986).

Hiroshi Suzuki, et al., "Highly Reliable Ultra–Thin $Ta_2O_5$ Capacitor Process Technology by Using $O_2$–Plasma Annealing Below 400° C.", International Conference on Solid State Devices and Materials, Extended Abstracts, pp. 862–864, (1993).

Y. Takaishi, et al., "Low–Temperature Integrated Process Below 500° C. for Thin $Ta_2O_5$ Capacitor for Giga–Bit DRAMs", *IEEE*, pp. 839–842, (1994).

Satoshi Tanimota, et al., "Behavior of Substrate–Originating Si Atoms during Chemical Vapor Deposition and Subsequent Active Oxygen Annealing of Tantalum Pentoxide Film", International Conference on Solid State Devices and Materials, Extended Abstracts, pp. 859–861, (1993).

D. Ugolini, et al., "Photoelectron spectroscopy studies of chemical vapor deposition of Ta from a $TaF_5$ precursor on Si and $SiO_2$ substrates", *J.Appl. Phys.*, vol. 70 No. 7, pp. 3899–3906, (Oct. 1, 1991).

Kwon, K., et al., "Low Temperature Tantalum Pentoxide Thin Films", *Material Research Society*, vol. 284, 505–510, (1993).

* cited by examiner

HIGH PRESSURE REOXIDATION/ANNEAL OF HIGH DIELECTRIC CONSTANT MATERIALS

FIELD OF THE INVENTION

The present invention relates to semiconductor structures and methods for fabricating such structures in semiconductor integrated circuits, and in particular, to forming capacitors for memory cells having high dielectric constant materials therein.

BACKGROUND OF THE INVENTION

Dynamic random access memories (DRAMs) are the most widely used form of semiconductor memory to date. DRAMs are composed of memory cell arrays and peripheral circuitry required for cell access and external input and output. Each memory cell array is formed of a plurality of memory cells for storing bits of data. Typical memory cells are formed of a capacitor, for storing electric charges and a transistor, for controlling charge and discharge of the capacitor. Of primary concern is maximizing the storage capacitance of each memory cell capacitor, particularly in light of the demand for 256 Mb DRAMs today and higher densities in the future without increasing the chip space required to form the array. There is a need to decrease the chip space required to form each memory cell while maximizing the capacitance of the memory cells. The importance of high density DRAMs can not be overstated in today's competitive microelectronics market. Devices are becoming smaller, but they are required to provide much more performance.

One way to achieve greater capacitance per unit area is to roughen the surface of the capacitor plate, increasing the surface area. As can be seen from the following equation (I), the most important parameters involved in achieving maximum charge, Q, stored on the capacitor are the thickness of the capacitive dielectric film ($t_{cdf}$), the area of the capacitor (A), and the dielectric constant ($\epsilon$). The voltage applied to the gate is $V_g$.

$$Q = (\epsilon \cdot A \cdot V_g)/t_{cdf} \quad (I)$$

Increasing the capacitor area (A) by forming the storage capacitor in a trench shape etched in the substrate is well known in the art, as well as using a stacked capacitor structure. Stacked-type capacitors feature a major part of the capacitor extending over the gate electrode and field isolating film of the underlying transistor. Such structures are generally composed of a lower plate electrode (consisting of a base portion a standing wall portion), a capacitive dielectric film, and an upper plate electrode. Other complex topographical lower plate electrode configurations have also been used to maximize the capacitive area (A) of a memory cell, such as fin-type, double-sided, and roughened lower plate electrode structures produced using hemispherical grain (HSG) polysilicon.

In addition to increasing the capacitive surface area (A) of a memory cell, as can be seen from the above equation (I), the thickness of the capacitive dielectric film ($t_{cdf}$) must be as thin as possible to maintain the maximum charge stored on the capacitor. However, the capacitive dielectric film must also prevent direct electrical contact between the lower and upper electrodes.

It is also desirable to utilize a capacitive dielectric film having as high of a dielectric constant ($\epsilon$) as possible to further increase the capacitance per unit area of a memory cell. Known high dielectric constant (HDC) materials include: tantalum penta oxide ($Ta_2O_5$), yttria ($Y_2O_3$), titanium oxide ($TiO_2$), strontium bismuth titanate (SBT), lead zirconate titanate (PZT), lanthanum-doped lead zirconate titanate (PLZT), barium strontium titanate (BST), bismuth titanate (BTO), strontium titanate (STO), barium titanate (BTO), and polymeric materials. A dielectric constant ($\epsilon$) of greater than 7 is typically considered to be a HDC material. For example, $Ta_2O_5$ potentially has a dielectric constant ($\epsilon$) more than 20 times greater than conventional silicon oxide, which has a dielectric constant ($\epsilon$) of 3.9. BST has a dielectric constant ($\epsilon$) about 100 times as large as that of a conventional silicon oxide film or a silicon nitride ($\epsilon$ about 7) film.

Currently, the use of HDC materials within a capacitor memory cell is limited by the instability of HDC materials and other component materials in an integrated circuit at higher temperatures. Such higher temperatures are required to treat the surface of HDC materials to conform to adjacent electrodes during the fabrication process. Furthermore, many of these HDC materials are ceramic in nature when formed in a thin layer, being so characterized by having low density. It is undesirable to utilize such low density materials in an application requiring a very thin layer of the material, because it allows current leakage through the capacitive dielectric film, degrading device performance. Thus, high temperature steps are often needed to densify/condition HDC materials.

It is undesirable to utilize high temperature steps during the fabrication of integrated circuits because high temperature steps consume valuable thermal budget. The thermal budget for an integrated circuit is that combination of maximum time and temperature for heat treatments utilized in the fabrication of the integrated circuit. An integrated circuit can only be subjected to a limited number of thermal steps for a limited amount of time before its electrical performance is potentially detrimentally affected. For example, thermal steps often cause dopant gradients at junctions between two regions in an integrated circuit to diffuse, such that the potential barrier between the two regions is altered. Furthermore, thermal steps often cause dopants to migrate into undesired regions, altering device characteristics. Since access transistors are formed prior to the capacitor in many DRAM devices, it is not desirable to use high temperatures to form the capacitor.

Due to the limitations of such HDC materials and methods for their formation, silicon oxide and silicon nitride are commonly used in capacitive memory cells. In order to minimize the thickness of the cell capacitive dielectric film and further increase the cell capacitance, silicon nitride is commonly used in such memory cells due to its superior qualities as compared to silicon oxide (another commonly used dielectric in semiconductor integrated circuit fabrication) at such thicknesses. At thicknesses of 100 angstroms or less, silicon oxide exhibits a high defect density. Silicon oxide is further undesirable for use in memory cells due to its comparatively low dielectric constant ($\epsilon$).

While silicon nitride is superior to silicon oxide at thicknesses below 100 angstroms, silicon nitride also has problems of its own. Pinholes, extending throughout a silicon nitride layer, often present in such silicon nitride films, lead to current leakage, which decreases capacitance and can further degrade devices over time, making them unreliable. However, the leakage current seen in silicon nitride films is typically not of the same magnitude as that seen in HDC films previously described. One attempt in overcoming the pinhole problem in silicon nitride films is to form a plurality of silicon nitride layers in place of a single layer, chancing the occurrence that pinholes in adjacent layers will not be aligned, thus preventing current leakage. However, this technique is not reliable and its use is limited in today's devices due to the need to make devices as small as possible.

There is a need for a method of forming capacitor memory cells having increased capacitance per unit area. Thus, there is a need for utilizing a HDC material as the capacitive dielectric film in a capacitor cell, in order to increase the capacitance per unit area in a memory cell. A method for integrating such HDC materials within a capacitor memory cell, such that the HDC material is relatively stable and has a relatively low leakage current, and a method utilizing a minimal amount of the thermal budget is needed. It is further desirable to form a capacitive dielectric film that is as thin and dense as possible, in order to conserve device density, decrease leakage current, and increase the capacitance per unit area in the memory cell.

SUMMARY OF THE INVENTION

The present invention teaches a method and apparatus for forming a capacitive memory cell, such as a dynamic random access memory (DRAM) cell, utilizing a high dielectric constant (HDC) material for the capacitive dielectric film. A bottom plate electrode of known shapes and topographies is prepared according to well known techniques. Then, the bottom plate electrode is cleaned as well known to one skilled in the art.

In one embodiment, a polysilicon, crystalline silicon, hemispherical grain polysilicon, germanium, or silicon-germanium bottom plate electrode material is used and the bottom plate electrode is subjected to a relatively high pressure surface treatment after its formation. The relatively high pressure surface treatment comprises one of rapid thermal nitridation (RTN) or oxidation (in an $O_2$, NO, or $N_2O$ ambient). When HDC materials, such as tantalum penta oxide ($Ta_2O_5$), yttria ($Y_2O_3$), or titanium oxide ($TiO_2$), all having a dielectric constant of approximately less than 100, are used for a capacitive dielectric film, RTN is typically used. A nitrogen-containing reactant gas, such as ammonia or hydrazine, is used during a RTN step.

When a batch-type processing chamber is used, a processing chamber pressure of up to approximately 100 atmospheres is used for the relatively high pressure surface treatment. Typically, processing chamber pressures of approximately 1 to 25 atmospheres suffice to effectuate the invention in a batch-type processing chamber. When a single wafer processing chamber is used, a processing chamber pressure of at least 1 atmosphere or higher is used for the high pressure surface treatment. Typically, processing chamber pressures of approximately 25 to 600 atmospheres suffice to effectuate the invention in a single wafer processing chamber.

By utilizing relatively high pressure for the surface treatment, surface treatment temperatures are reduced to approximately 100 degrees Celsius or higher, conserving valuable thermal budget during the integrated circuit fabrication process. Typically, processing chamber temperatures of approximately 200 to 950 degrees Celsius are used when practicing the invention. Cold wall or hot wall type processing chambers can be used to practice the invention. Heating methods are well known to those skilled in the art, including resistive heating and rapid thermal processing.

Next, a HDC material (i.e., a material having a dielectric constant ($\epsilon$) of 7 or greater) is formed as a capacitive dielectric film on the bottom plate electrode. The method for forming HDC materials is well known to one skilled in the art. Such HDC materials include: tantalum penta oxide ($Ta_2O_5$), yttria ($Y_2O_3$), titanium oxide ($TiO_2$), strontium bismuth titanate (SBT), lead zirconate titanate (PZT), lanthanum-doped lead zirconate titanate (PLZT), barium strontium titanate (BST), bismuth titanate (BiTO), strontium titanate (STO), barium titanate (BaTO), and polymeric materials. Inorganic or organic precursors, both liquids and/or solids, are used for starting materials when depositing such HDC materials. HDC materials are deposited in any manner known to those skilled in the art, including physical vapor deposition, chemical vapor deposition (CVD), low pressure chemical vapor deposition (LPCVD), plasma-enhanced chemical vapor deposition (PECVD), and rapid thermal chemical vapor deposition (RTCVD).

The capacitive dielectric film is then subjected to a relatively high pressure surface treatment to densify/condition the material. The relatively high pressure surface treatment comprises oxidation (in an $O_2$, NO, or $N_2O$ ambient). Oxidation tends to fill oxygen vacancies often present in the lattice structure of as-deposited HDC materials, densifying/conditioning the capacitive dielectric film and increasing its capacitance.

As in the bottom plate electrode relatively high pressure surface treatment, when a batch-type processing chamber is used, a processing chamber pressure of up to approximately 100 atmospheres is used for the relatively high pressure surface treatment. Typically, processing chamber pressures of approximately 1 to 25 atmospheres suffice to effectuate the invention in a batch-type processing chamber. When a single wafer processing chamber is used, a processing chamber pressure of at least 1 atmosphere or higher is used for the high pressure surface treatment. Typically, processing chamber pressures of approximately 25 to 600 atmospheres suffice to effectuate the invention in a single wafer processing chamber.

By utilizing relatively high pressure for the surface treatment, surface treatment temperatures are reduced to approximately 100 degrees Celsius or higher, conserving valuable thermal budget during the integrated circuit fabrication process. Typically, processing chamber temperatures of approximately 200 to 950 degrees Celsius are used when practicing the invention.

In another embodiment of the invention, a metallic material, such as titanium, titanium nitride, platinum, platinum-aluminum, rhodium, rhodium oxide, cesium oxide, or strontium rhodium oxide (SRO), is used for the bottom plate electrode. When a metallic material is used for the bottom plate electrode, a relatively high pressure surface treatment is not needed prior to forming the capacitive dielectric film thereon because the diffusion problem of silicon/HDC material interfaces is not present.

Next, a HDC material (i.e., a material having a dielectric constant ($\epsilon$) of 7 or greater) is formed as a capacitive dielectric film on the metallic bottom plate electrode. The method for forming HDC materials is well known to one skilled in the art. Such HDC materials include: tantalum penta oxide ($Ta_2O_5$), yttria ($Y_2O_3$), titanium oxide ($TiO_2$), strontium bismuth titanate (SBT), lead zirconate titanate (PZT), lanthanum-doped lead zirconate titanate (PLZT), barium strontium titanate (BST), bismuth titanate (BiTO), strontium titanate (STO), barium titanate (BaTO), and polymeric materials.

The capacitive dielectric film is then subjected to a relatively high pressure surface treatment to densify/condition the material. The relatively high pressure surface treatment comprises oxidation (in an $O_2$, NO, or $N_2O$ ambient). Oxidation tends to fill oxygen vacancies often present in the lattice structure of as-deposited HDC materials, densifying/conditioning the capacitive dielectric film and increasing its capacitance.

When a batch-type processing chamber is used, a processing chamber pressure of up to approximately 100 atmospheres is used for the relatively high pressure surface treatment. Typically, processing chamber pressures of approximately 1 to 25 atmospheres suffice to effectuate the invention in a batch-type processing chamber. When a single wafer processing chamber is used, a processing chamber pressure of at least 1 atmosphere or higher is used for the high pressure surface treatment. Typically, processing chamber pressures of approximately 25 to 600 atmospheres suffice to effectuate the invention in a single wafer processing chamber.

By utilizing relatively high pressure for the surface treatment, surface treatment temperatures are reduced to approximately 100 degrees Celsius or higher, conserving valuable thermal budget during the integrated circuit fabrication process. Typically, processing chamber temperatures of approximately 200 to 950 degrees Celsius are used when practicing the invention. Cold wall or hot wall type processing chambers can be used to practice the invention. Heating methods are well known to those skilled in the art, including resistive heating and rapid thermal processing.

To complete formation of the capacitor structure in both embodiments described previously, a top plate electrode is formed on the capacitive dielectric film as well known to one skilled in the art. The resulting capacitor has an increased capacitance per unit area as compared to previously used capacitors, due to its effective incorporation of a HDC material. Thus, the capacitor structure of the present invention is advantageously used in memories, such as DRAMs, enabling memories to be made more dense, as demanded by current consumers.

Surface treatments are typically needed to densify/condition the dielectric material and provide a barrier layer between the electrode and the dielectric materials. By utilizing the method of the invention, a HDC material is able to be deposited effectively on a bottom plate electrode. Previously, HDC materials, such as $Ta_2O_5$, were unable to be used adjacent to a polysilicon surface because of the tendency for the two materials to react in an uncontrolled manner, forming silicon oxide at the polysilicon/$Ta_2O_5$ interface. It is advantageous to use polysilicon for the bottom plate electrode because the same layer of polysilicon can be used as is used in other parts of an integrated circuit, such as for the gate of an access transistor. While a thin diffusion barrier layer ($Si_3N_4$ or $SiO_2$) is needed between the polysilicon bottom plate electrode and the HDC capacitive dielectric film, it is undesirable for the diffusion barrier layer to become too thick. This undesirable consequence is prevented by using relatively high pressure surface treatments of the present invention.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Wafer and substrate are used interchangeably to refer to supporting semiconductor structures during processing. Both are to be understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure.

FIGS. 1A to 1F represent, generally, capacitor memory cell structures 100 formed in accordance with the method of the invention. The following description details process steps utilized to form the capacitor memory cell structures 100. In particular, the process steps described are directed towards forming a high dielectric constant (HDC) capacitive dielectric film 102 between bottom and top plate electrodes 104 and 106, respectively, in each capacitor memory cell structure 100.

Figure 1A:
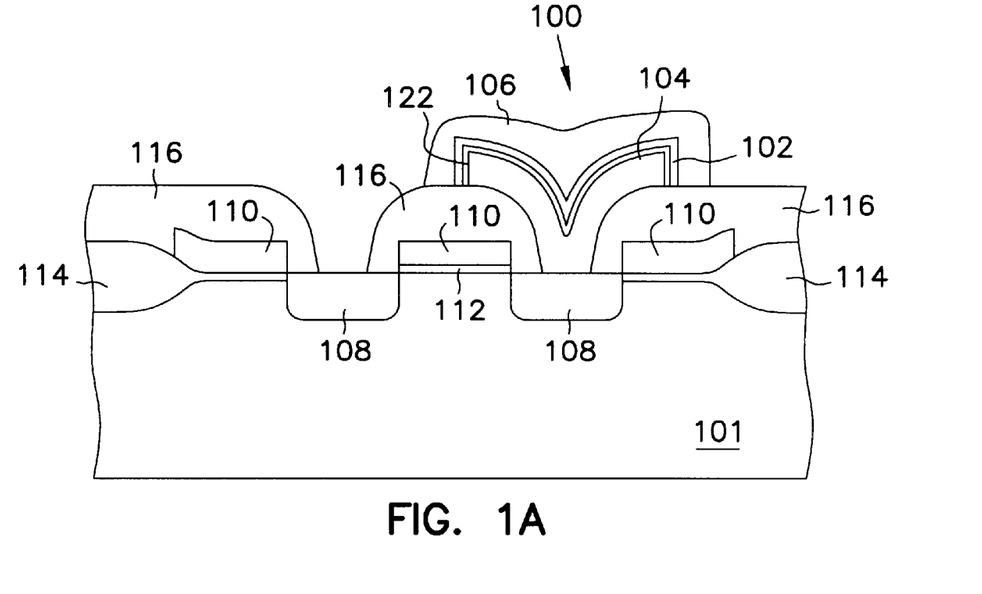
FIG. 1A is a cross-sectional representation of a polysilicon electrode stacked, double-sided capacitor memory cell formed according to the method of the invention, wherein the capacitor is stacked on a source/drain region of an underlying access transistor.

FIG. 1A is a cross-sectional representation of a stacked, double-sided capacitor memory cell 100 formed according to the method of the invention, wherein the capacitor is stacked on a source/drain region 108 of an underlying access transistor. The access transistor comprises source/drain regions 108 on both sides of a gate structure, which includes a polysilicon gate 110 and gate oxide 112. The access transistor is fabricated in an active area of an underlying substrate 101 that is defined by field oxide 114. Typically, the gate oxide 112 and the field oxide 114 are formed using a conventional method, such as LOCal Oxidation of Silicon (LOCOS). The capacitor memory cell 100 is supported over the source/drain region 108 by an insulating material 116, such as borophosphosilicate glass (BPSG), which reflows easily to produce rounded corners over the gate 110, allowing better step coverage.

Figure 1B:
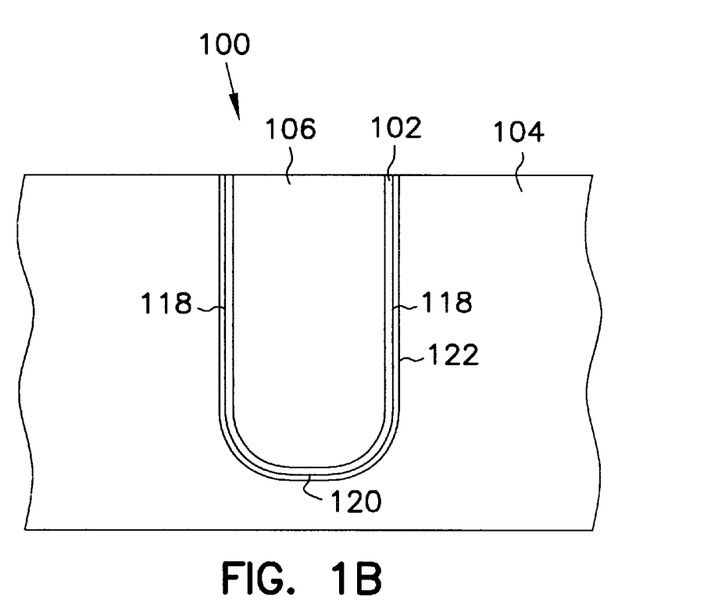
FIG. 1B is a cross-sectional representation of a trench-type capacitor memory cell formed according to the method of the invention.
Figure 1C:
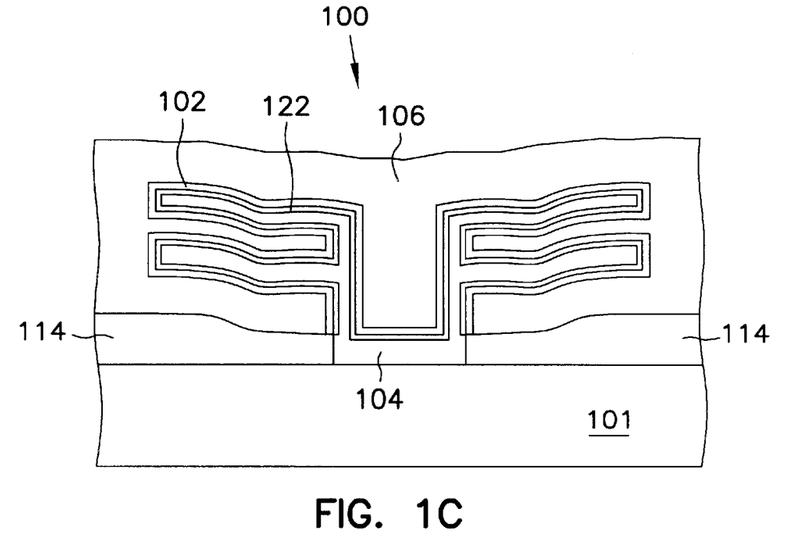
FIG. 1C is a cross-sectional representation of a fin-type capacitor memory cell formed according to the method of the invention.
Figure 1D:
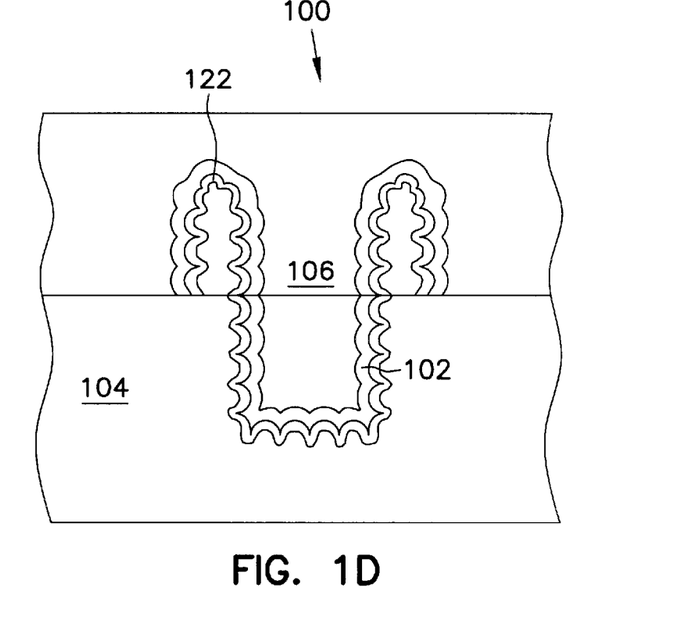
FIG. 1D is a cross-sectional representation of a trench-type, double-sided, roughened polysilicon electrode capacitor memory cell formed according to the method of the invention.

FIGS. 1B to 1D illustrate further configurations for the bottom plate electrode 108 and capacitor memory cell 100 structure. FIG. 1B is a cross-sectional representation of a trench-type capacitor memory cell 100 formed according to the method of the invention, wherein the trench shape is defined by sidewalls 118 and a bottom surface 120. FIG. 1C is a cross-sectional representation of a fin-type capacitor memory cell 100 formed according to the method of the invention. FIG. 1D is a cross-sectional representation of a trench-type, double-sided, roughened electrode capacitor memory cell 100 formed according to the method of the invention.

Figure 1E:
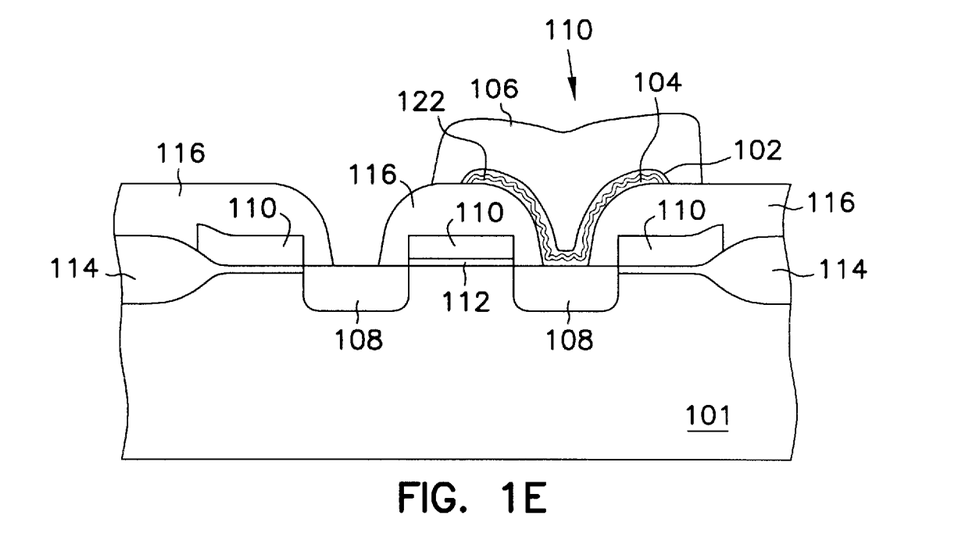
FIG. 1E is a cross-sectional representation of a stacked, roughened polysilicon electrode capacitor memory cell formed according to the method of the invention, wherein the capacitor is stacked on a source/drain region of an underlying access transistor.
Figure 1F:
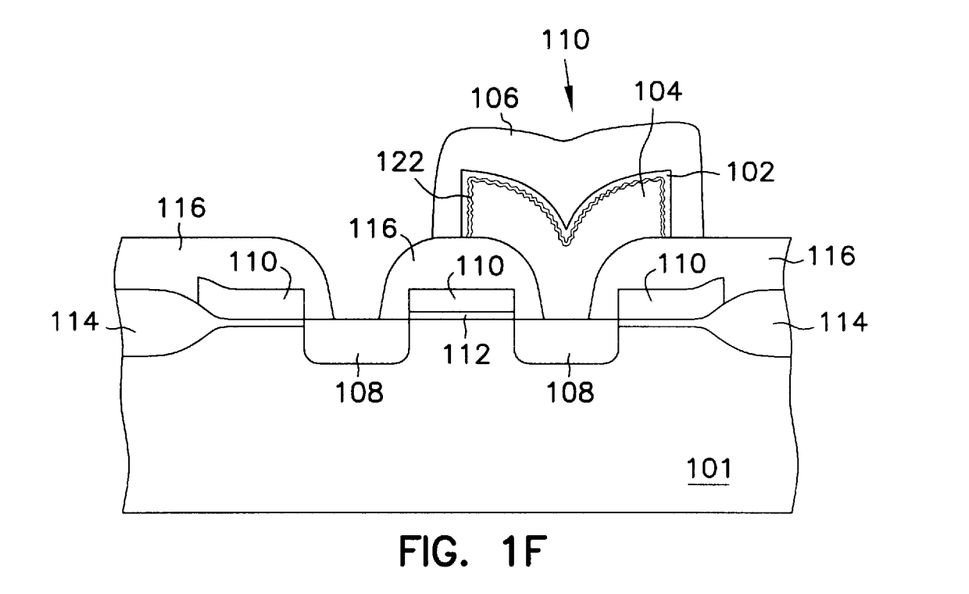
FIG. 1F is a cross-sectional representation of a stacked, double-sided, roughened polysilicon electrode capacitor memory cell formed according to the method of the invention, wherein the capacitor is stacked on a source/drain region of an underlying access transistor.

FIGS. 1E and 1D illustrate still further configurations for stacked capacitor memory cell structures 100. FIG. 1E is a cross-sectional representation of a stacked, roughened electrode capacitor memory cell 100 formed according to the method of the invention. FIG. 1F is a cross-sectional representation of a stacked, double-sided, roughened electrode capacitor memory cell 100 formed according to the method of the invention.

FIGS. 1A to 1F are meant to be illustrative, generally, of various capacitor 100 shapes and electrode 104, 106 topographies that increase the surface area of the capacitor memory cell 100. The capacitor 100 shape and topography of the electrodes 104 and 106 in a capacitor memory cell 100 are not critical to practicing the invention. Thus, FIGS. 1A to 1F are merely illustrative of example capacitor 100 shapes and electrode 104, 106 topographies. The scope of the invention is not meant to be limited to those capacitor memory cell structures 100 illustrated.

In one embodiment, polysilicon, crystalline silicon, hemispherical grain polysilicon, germanium, or silicon-germanium (deposited using chemical vapor deposition) is used as the electrode 104, 106 material in a capacitor memory cell 100. An increased surface area polysilicon bottom plate electrode 104 is formed over a supporting semiconductor structure, as well known to one skilled in the art. The shape of the bottom plate electrode 104 illustrated in FIGS. 1A to 1F is selected from the group consisting of: stacked-type, fin-type, and trench-type structures, to provide an increased capacitive surface area for the memory cell 100. The topography of the bottom plate electrode 104 illustrated in FIGS. 1A to 1F is selected from the group consisting of: single-sided, double-sided, and roughened lower plate electrode 104 topographies produced using hemispherical grain (HSG) polysilicon. The bottom plate electrode 104 can be doped or undoped, rough or smooth. Phosphorus is a common dopant for a bottom plate electrode 104.

After cleaning the bottom plate electrode 104, such as with a hydrofluoric acid (HF) solution as well known to one skilled in the art, the bottom plate electrode 104 is subjected to a relatively high pressure surface treatment. Rapid thermal nitridation (RTN) or oxidation (in an $O_2$, NO, or $N_2O$ ambient) effectuates the relatively high pressure surface treatment. RTN is performed using a combination of relatively high temperatures and a nitrogen-containing ambient, such as ammonia ($NH_3$) or hydrazine ($N_2H_4$). When HDC materials, such as tantalum penta oxide ($Ta_2O_5$), yttria ($Y_2O_3$), or titanium oxide ($TiO_2$), all having a dielectric constant of approximately less than 100, are used for a capacitive dielectric film 102, RTN is typically used instead of oxidation.

When a batch-type processing chamber is used, a processing chamber pressure of up to approximately 100 atmospheres is used for the relatively high pressure surface treatment. Typically, processing chamber pressures of approximately 1 to 25 atmospheres suffice to effectuate the invention in a batch-type processing chamber. When a single wafer processing chamber is used, a processing chamber pressure of at least 1 atmosphere or higher is used for the high pressure surface treatment. Typically, processing chamber pressures of approximately 25 to 600 atmospheres suffice to effectuate the invention in a single wafer processing chamber. The GaSonics, Inc. VHP batch-type processing chamber may be used in practicing this invention.

By utilizing relatively high pressure for the surface treatment, surface treatment temperatures are reduced to approximately 100 degrees Celsius or higher, conserving valuable thermal budget during the integrated circuit fabrication process. Typically, processing chamber temperatures of approximately 200 to 950 degrees Celsius may be used when practicing the invention, as compared to previously used temperatures of 1,000 degrees Celsius. Cold wall or hot wall type processing chambers can be used to practice the invention. Heating methods for each type of processing chamber are well known to those skilled in the art, including resistive heating and rapid thermal processing.

This first relatively high pressure surface treatment forms a diffusion barrier 122 between the bottom plate electrode 104 and the capacitive dielectric film 102. In the absence of such a diffusion barrier 122, silicon/germanium from the bottom plate electrode 104 and the capacitor dielectric 102 material react in an undesirably uncontrolled manner to form a $Si_3N_4$, $SiO_2$, $GeO_2$, or $Ge_3N_4$ diffusion barrier layer 122.

While a thin diffusion barrier layer 122 ($Si_3N_4$, $SiO_2$, $GeO_2$, or $Ge_3N_4$) is needed between the bottom plate electrode 104 and the HDC capacitive dielectric film 102, it is undesirable for the diffusion barrier layer 122 to become too thick because it decreases the capacitance of the memory cell 100 by increasing the distance between the electrodes 104 and 106. By using such relatively high pressures to treat the surface of the bottom plate electrode 104, the thickness of the diffusion barrier layer 122 does not become too thick, especially during subsequent HDC film 102 surface treatment steps. Relatively high pressures are used for the subsequent HDC film 102 surface treatment in order to lower the surface treatment temperatures required. By lowering the surface treatment temperatures, an uncontrolled, undesirable increase in the thickness of the diffusion barrier layer 122 is further prevented.

Another problem associated with diffusion between the bottom plate electrode 104 and the HDC capacitive dielectric film 102 is an increase in leakage current. The leakage current undesirably increases in capacitive structures, in which an adequate diffusion barrier layer 122 is not present, due to the migration of silicon/germanium from the bottom plate electrode 104 into the capacitive dielectric film 102. The leakage current problem is particularly acute in conventional HDC materials due to their low density. Thus, it is essential to form a diffusion barrier layer 122 between the HDC capacitive dielectric film 102 and the bottom plate electrode 104.

A capacitive dielectric film 102 material is selected from the group consisting of HDC materials (i.e., those having a dielectric constant of 7 or greater). Such HDC materials include: tantalum penta oxide ($Ta_2O_5$), yttria ($Y_2O_3$), titanium oxide ($TiO_2$), strontium bismuth titanate (SBT), lead zirconate titanate (PZT), lanthanum-doped lead zirconate titanate (PLZT), barium strontium titanate (BST), bismuth titanate (BiTO), strontium titanate (STO), barium titanate (BaTO), and polymeric materials. HDC materials utilized in this invention include both doped and undoped materials, as previously described. It is preferable that the HDC material used in the capacitive dielectric film 102 be stoichiometric. Stoichiometric films 102 have a lower defect density, resulting in a decreased leakage current. This is essential for optimum electrical properties, particularly in memory cells.

The capacitor dielectric material 102 selected is deposited on the supporting bottom plate electrode 104, in a manner well known to those skilled in the art. Inorganic or organic precursors, both liquids and/or solids, are used for starting materials when depositing such HDC materials. HDC materials are deposited in any manner known to those skilled in the art, including physical vapor deposition, chemical vapor deposition (CVD), low pressure chemical vapor deposition (LPCVD), plasma-enhanced chemical vapor deposition (PECVD), and rapid thermal chemical vapor deposition (RTCVD).

Reference is made to "A High-C Capacitor (20.4 fF/$\mu m^2$) with Ultrathin CVD-$Ta_2O_5$ Films Deposited on Rugged Poly-Si for High Density DRAMs," by Fazan et al., incorporated herein by reference. Further reference is made to "Ultrathin $Ta_2O_5$ Films on Rapid Thermal Nitrided Rugged Polysilicon for High Density DRAMs," by Fazan et al., incorporated herein by reference. Certain HDC materials can also be formed by depositing one constituent and oxidizing to form the HDC material. For example, one method to form $Ta_2O_5$ involves depositing tantalum on a substrate and oxidizing to form $Ta_2O_5$. Similarly, one method for forming $Y_2O_3$ involves depositing yttrium on a substrate and oxidizing to form $Y_2O_3$. However, both $Ta_2O_5$ and $Y_2O_3$ can also be formed by using CVD to deposit the material on a substrate. For example, using $Ta(OC_2H_5)_5$ and oxygen, $Ta_2O_5$ can be deposited using LPCVD at temperatures of approximately 400 to 500 degrees Celsius.

When HDC capacitive dielectric films 102, such as $Ta_2O_5$, $Y_2O_3$, or $TiO_2$, are used, the thickness of the capacitive dielectric film 102 is approximately 30 to 200 angstroms, and typically 90 angstroms. When HDC capacitive dielectric films 102, such as SBT, PZT, PLZT, BST, BiTO, STO, BaTO, and polymeric materials are used, the thickness of the capacitive dielectric film 102 is typically greater. For example, for BST, the thickness is approximately 100 to 4,000 angstroms. These capacitive dielectric films 102 are formed having a greater thickness than those using $Ta_2O_5$, $Y_2O_3$, and $TiO_2$, due to their higher dielectric constants.

Figure 1G:
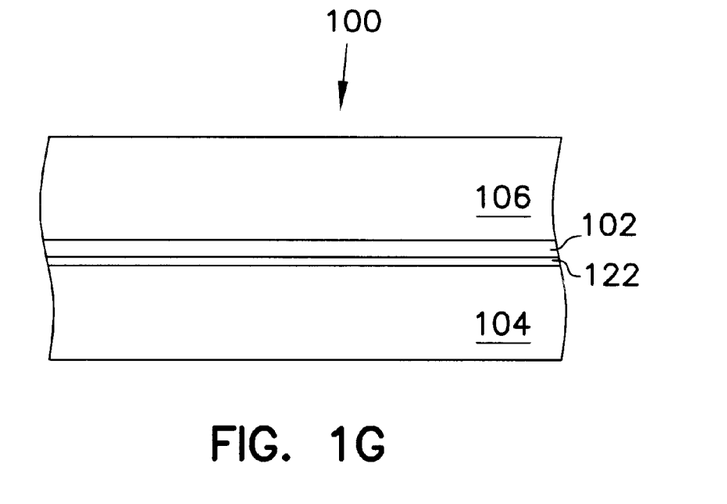
FIG. 1G is a cross-sectional representation of a planar capacitor formed according to the method of the invention.

While most applications utilize capacitor structures 100 that are shaped to provide more capacitive surface area, as described previously, the present invention is also applicable to forming simple planar capacitors 100 as shown in FIG. 1G. As illustrated in this further embodiment of the invention, a planar substrate is used for the bottom plate electrode 104 in a capacitive memory cell 100. The bottom plate electrode 104 is then subjected to a relatively high pressure treatment as described previously with reference to an increased surface area bottom plate electrode 104, as shown in FIGS. 1A to 1F.

After the capacitive dielectric film 102 is formed, the capacitive dielectric film 102 is subjected to a relatively high pressure surface treatment to densify/condition the HDC material from which it is fabricated. The relatively high pressure surface treatment comprises oxidation (in an $O_2$, NO, or $N_2O$ ambient). Oxidation tends to fill oxygen vacancies often present in the lattice structure of as-deposited HDC materials, densifying/conditioning the capacitive dielectric film 102 and increasing its capacitance. However, RTN can be used in addition to and prior to oxidation, in accordance with the RTN process described for the pre-HDC deposition step.

When a batch-type processing chamber is used, a processing chamber pressure of up to approximately 100 atmospheres is used for the relatively high pressure surface treatment. Typically, processing chamber pressures of approximately 1 to 25 atmospheres suffice to effectuate the invention in a batch-type processing chamber. When a single wafer processing chamber is used, a processing chamber pressure of at least 1 atmosphere or higher is used for the high pressure surface treatment. Typically, processing chamber pressures of approximately 25 to 600 atmospheres suffice to effectuate the invention in a single wafer processing chamber.

By utilizing relatively high pressure for the surface treatment, surface treatment temperatures are reduced to approximately 100 degrees Celsius or higher, conserving valuable thermal budget during the integrated circuit fabrication process. Typically, processing chamber temperatures of approximately 200 to 950 degrees Celsius are used when practicing the invention.

In further embodiments of the invention, an anneal, such as a sub-atmospheric pressure anneal or an ultraviolet-assisted rapid thermal processing (RTP) anneal is performed either before or after the relatively high pressure capacitive dielectric film 102 surface treatment. However, such an anneal step is not necessary for practicing this invention.

To complete formation of the capacitor structure 100 illustrated in FIGS. 1A to 1G, a top plate electrode 106 is formed on the capacitive dielectric film 102 as well known to one skilled in the art. The top plate electrode 106 can be formed from the same material as the bottom plate electrode 104. However, this is not critical for practicing the invention.

The resulting capacitor 100 has an increased capacitance per unit area as compared to previously used capacitors because a HDC material is utilized for the capacitive dielectric film 102. Furthermore, the leakage current of the capacitive dielectric film 102 is reduced as compared to as-deposited HDC capacitive dielectric films. As roughly illustrated in FIG. 1H, a XRD scan of intensity versus angle (2θ) for resulting capacitors, formed with a tantalum penta oxide capacitive dielectric film 102, illustrates how the high pressure surface treatments affect the resulting crystal structure of capacitors. The solid line 121 represents generally the resulting crystal structure for a capacitor 100 formed according to the method of the invention, in a GaSonics, Inc. VHP furnace (the VHP). The broken line 123 represents the resulting crystal structure for a control capacitor formed. By comparison, when using the VHP, a mixed crystal orientation is seen in resulting films, as evidenced by the additional peak 125. When not using the VHP, as illustrated by line 123, a single crystal orientation results. A mixed crystal orientation contributes to the reduced leakage current of the resulting capacitor 100. Thus, the capacitor structure 100 of the present invention is advantageously used in memories, such as DRAMs, enabling memories to be made more dense, as demanded by current consumers. By utilizing relatively high pressure for surface treatment of the bottom plate electrode 104 and densification of the dielectric capacitive film 102, lower processing temperatures can be used. Thus, this invention conserves valuable thermal budget during the integrated circuit fabrication process.

In another embodiment, a metallic material, such as tungsten, tungsten nitride, titanium, titanium nitride, platinum, platinum-aluminum, rhodium, rhodium oxide, cesium oxide, or strontium rhodium oxide (SRO), is used for the bottom plate electrode 204 in a capacitor memory cell 200, as illustrated in FIGS. 2A to 2D. The metallic material can be sputtered or deposited using CVD. When a metallic material is used for the bottom plate electrode 204, a relatively high pressure surface treatment is not needed prior to forming the capacitive dielectric film 202 thereon because the diffusion problem of silicon/HDC material interfaces is not present. When using HDC materials for the subsequently-formed capacitive dielectric film 202, comprising a material having a perovskite crystal structure, such as SBT, PZT, PLZT, BST, BiTO, STO, BaTO, it is advantageous to use a bottom plate electrode 204 material that is or is close to the perovskite crystal structure, such as SRO. By using a perovskite bottom plate electrode 204 adjacent to a perovskite capacitive dielectric film 202, lattice mismatch is minimized at the interface between the two materials, resulting in less mechanical stress at the interface. It is advantageous to have less mechanical stress at an interface in a device, both for mechanical integrity and electrical integrity of a device.

Figure 2A:
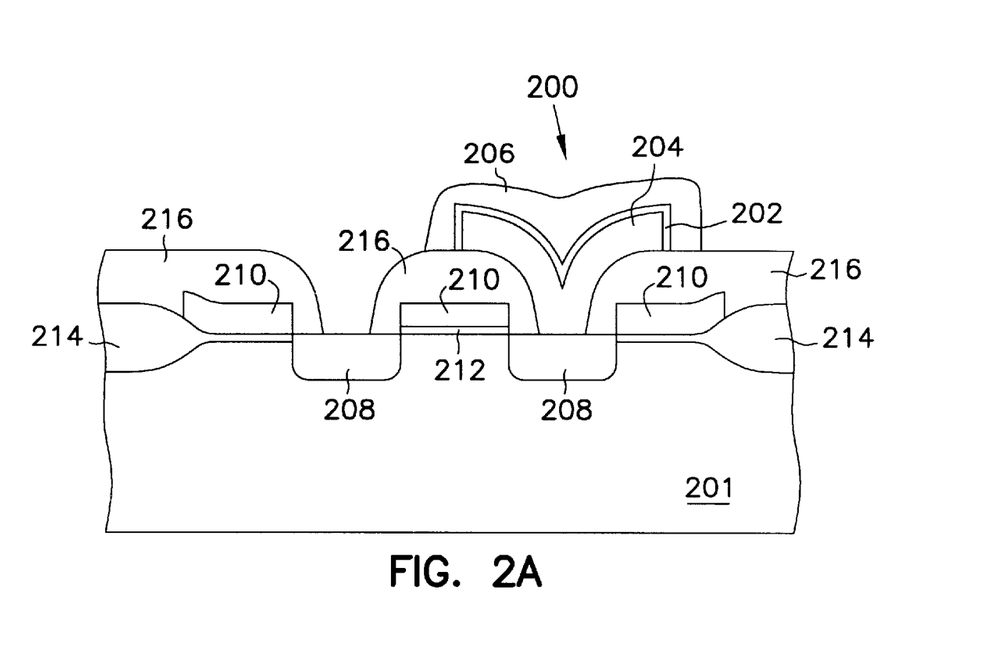
FIG. 2A is a cross-sectional representation of a metallic electrode stacked, double-sided capacitor memory cell formed according to the method of the invention, wherein the capacitor is stacked on a source/drain region of an underlying access transistor.
Figure 2B:
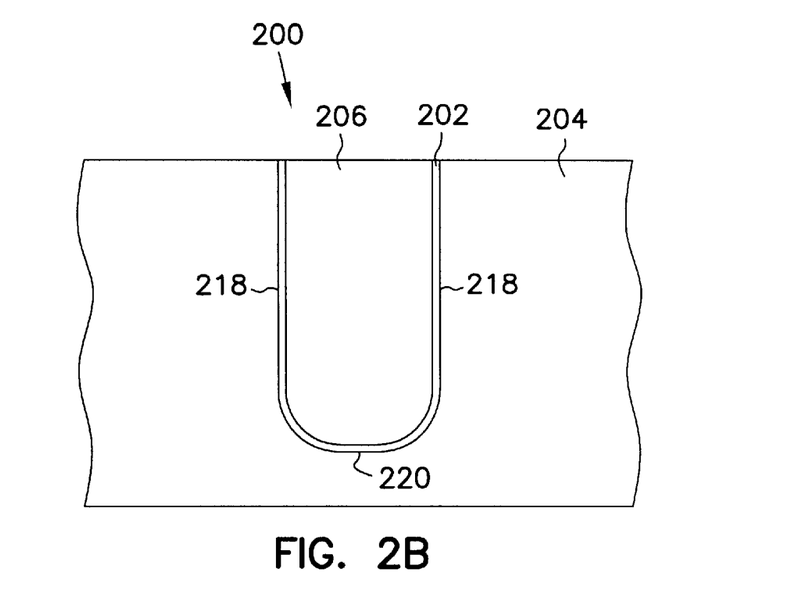
FIG. 2B is a cross-sectional representation of a metallic electrode trench-type capacitor memory cell formed according to the method of the invention.
Figure 2C:
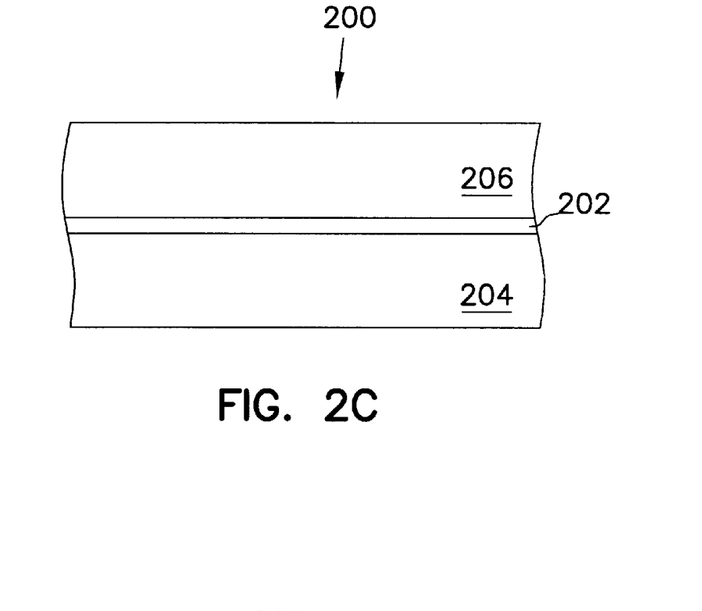
FIG. 2C is a cross-sectional representation of a metallic electrode fin-type capacitor memory cell formed according to the method of the invention.

An increased surface area metallic bottom plate electrode 204 is formed over a supporting semiconductor structure, as well known to one skilled in the art. FIGS. 2A to 2C are meant to be illustrative, generally, of various capacitor 200 shapes and electrode 204, 206 topographies that increase the surface area of the capacitor memory cell 200. The capacitor 200 shape and topography of the electrodes 204 and 206 in a capacitor memory cell 200 are not critical to practicing the invention. Thus, FIGS. 2A to 2C are merely illustrative of example capacitor 200 shapes and electrode 204, 206 topographies. The scope of the invention is not meant to be limited to those capacitor memory cell structures 200 illustrated. The shape of the metallic bottom plate electrode 204 illustrated in FIGS. 2A to 2C is selected from the group consisting of: stacked-type, fin-type, and trench-type structures, to provide an increased capacitive surface area for the memory cell 200. The topography of the metallic bottom plate electrode 204 illustrated in FIGS. 2A to 2C is selected from the group consisting of: single-sided and double-sided.

Figure 2D:
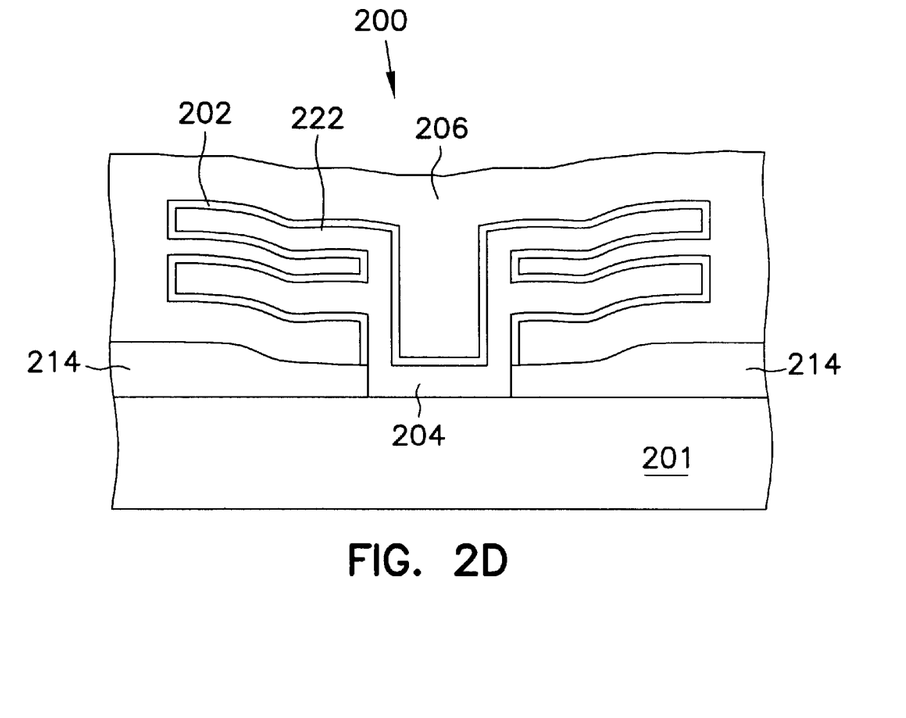
FIG. 2D is a cross-sectional representation of a planar metallic electrode capacitor formed according to the method of the invention.

While most applications utilize capacitor structures 200 that are shaped to provide more capacitive surface area, as described previously, the present invention is also applicable to forming simple planar capacitors 200 as shown in FIG. 2D. As illustrated in this further embodiment of the invention, a planar metallic substrate is used for the bottom plate electrode 204 in a capacitive memory cell 200.

Next, a capacitive dielectric film 202 is formed on the metallic bottom plate electrode 204. A capacitive dielectric film 202 material is selected from the group consisting of HDC materials (i.e., those having a dielectric constant of 7 or greater). Such HDC materials include: $Ta_2O_5$, $Y_2O_3$, $TiO_2$, SBT, PZT, PLZT, BST, BiTO, STO, BaTO, and polymeric materials. HDC materials utilized in this invention include both doped and undoped materials, as previously described. It is preferable that the HDC material used in the capacitive dielectric film 202 be stoichiometric. Stoichiometric films 202 have a lower defect density, resulting in a decreased leakage current. This is essential for optimum electrical properties, particularly in memory cells.

The HDC material selected is then deposited on the supporting bottom plate electrode 204. HDC materials utilized in this invention include both doped and undoped materials, as previously described. Inorganic or organic precursors, both liquids and/or solids, are used for starting materials when depositing such HDC materials. HDC materials are deposited in any manner known to those skilled in the art, including physical vapor deposition, chemical vapor deposition (CVD), low pressure chemical vapor deposition (LPCVD), plasma-enhanced chemical vapor deposition (PECVD), and rapid thermal chemical vapor deposition (RTCVD).

When HDC capacitive dielectric films 202, such as $Ta_2O_5$, $Y_2O_3$, or $TiO_2$, are used, the thickness of the capacitive dielectric film 202 is approximately 30 to 200 angstroms, and typically 90 angstroms. When HDC capacitive dielectric films 202, such as SBT, PZT, PLZT, BST, BiTO, STO, BaTO, and polymeric materials are used, the thickness of the capacitive dielectric film 202 is typically greater. For example, for BST, the thickness is approximately 100 to 4,000 angstroms. These capacitive dielectric films 202 are formed having a greater thickness than those using $Ta_2O_5$, $Y_2O_3$, and $TiO_2$, due to their higher dielectric constants.

After the capacitive dielectric film 202 is formed, the capacitive dielectric film 202 is subjected to a relatively high pressure surface treatment to densify/condition the HDC material from which it is fabricated. The relatively high pressure surface treatment comprises oxidation (in an $O_2$, NO, or $N_2O$ ambient). Oxidation tends to fill oxygen vacancies often present in the lattice structure of as-deposited HDC materials, densifying/conditioning the capacitive dielectric film 202 and increasing its capacitance. However, RTN can be used in addition to and prior to oxidation, in accordance with the RTN process described for the pre-HDC deposition step.

When a batch-type processing chamber is used, a processing chamber pressure of up to approximately 100 atmospheres is used for the relatively high pressure surface treatment. Typically, processing chamber pressures of approximately 1 to 25 atmospheres suffice to effectuate the invention in a batch-type processing chamber. When a single wafer processing chamber is used, a processing chamber pressure of at least 1 atmosphere or higher is used for the high pressure surface treatment. Typically, processing chamber pressures of approximately 25 to 600 atmospheres suffice to effectuate the invention in a single wafer processing chamber.

By utilizing relatively high pressure for the surface treatment, surface treatment temperatures are reduced to approximately 100 degrees Celsius or higher, conserving valuable thermal budget during the integrated circuit fabrication process. Typically, processing chamber temperatures of approximately 200 to 950 degrees Celsius are used when practicing the invention.

In further embodiments of the invention, an anneal, such as a sub-atmospheric pressure anneal or an ultraviolet-assisted rapid thermal processing (RTP) anneal is performed either before or after the relatively high pressure capacitive dielectric film 202 surface treatment. However, such an anneal step is not necessary for practicing this invention.

In yet a further embodiment of the invention, a cleaning step is performed after the relatively high pressure surface treatment. Such a cleaning step is well known to one skilled in the art. A gas, such as ammonia, chlorine, or other halogens, is introduced into the processing chamber either at atmospheric pressure or at high pressure, as defined in the invention.

To complete formation of the capacitor structure 200 illustrated in FIGS. 2A to 2D, a top plate electrode 206 is formed on the capacitive dielectric film 202 as well known to one skilled in the art. The top plate electrode 206 can be formed from the same material as the bottom plate electrode 204. However, this is not critical for practicing the invention.

The resulting capacitor 200 has an increased capacitance per unit area as compared to previously used capacitors because a HDC material is utilized for the capacitive dielectric film 202. Furthermore, the leakage current of the capacitive dielectric film 202 is reduced as compared to as-deposited HDC capacitive dielectric films. Thus, the capacitor structure 200 of the present invention is advantageously used in memories, such as DRAMs, enabling memories to be made more dense, as demanded by current consumers. By utilizing relatively high pressure for densification of the dielectric capacitive film 202, lower processing temperatures can be used. Thus, this invention conserves valuable thermal budget during the integrated circuit fabrication process.

Figure 1H:
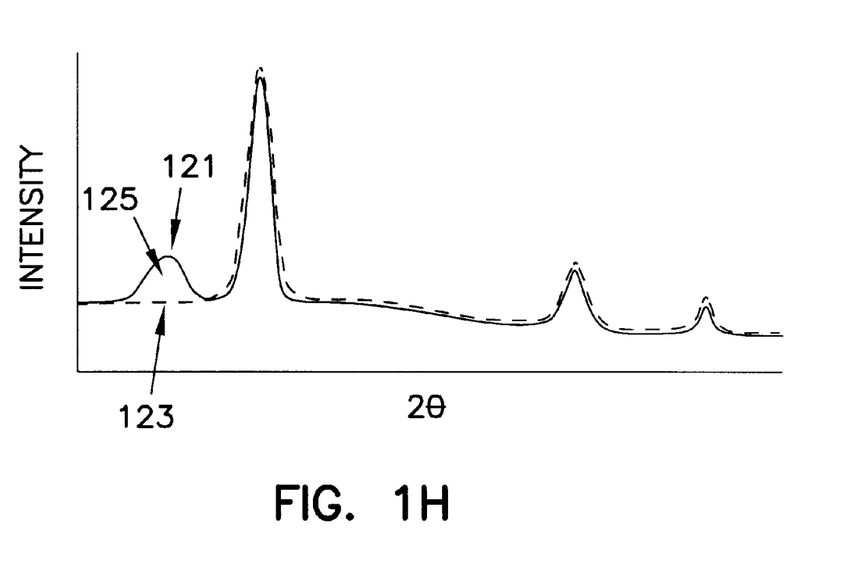
FIG. 1H is a representation of a typical XRD scan for a capacitor formed according to the method of the invention, wherein the high dielectric constant capacitive dielectric film comprises tantalum penta oxide.
Figure 3:
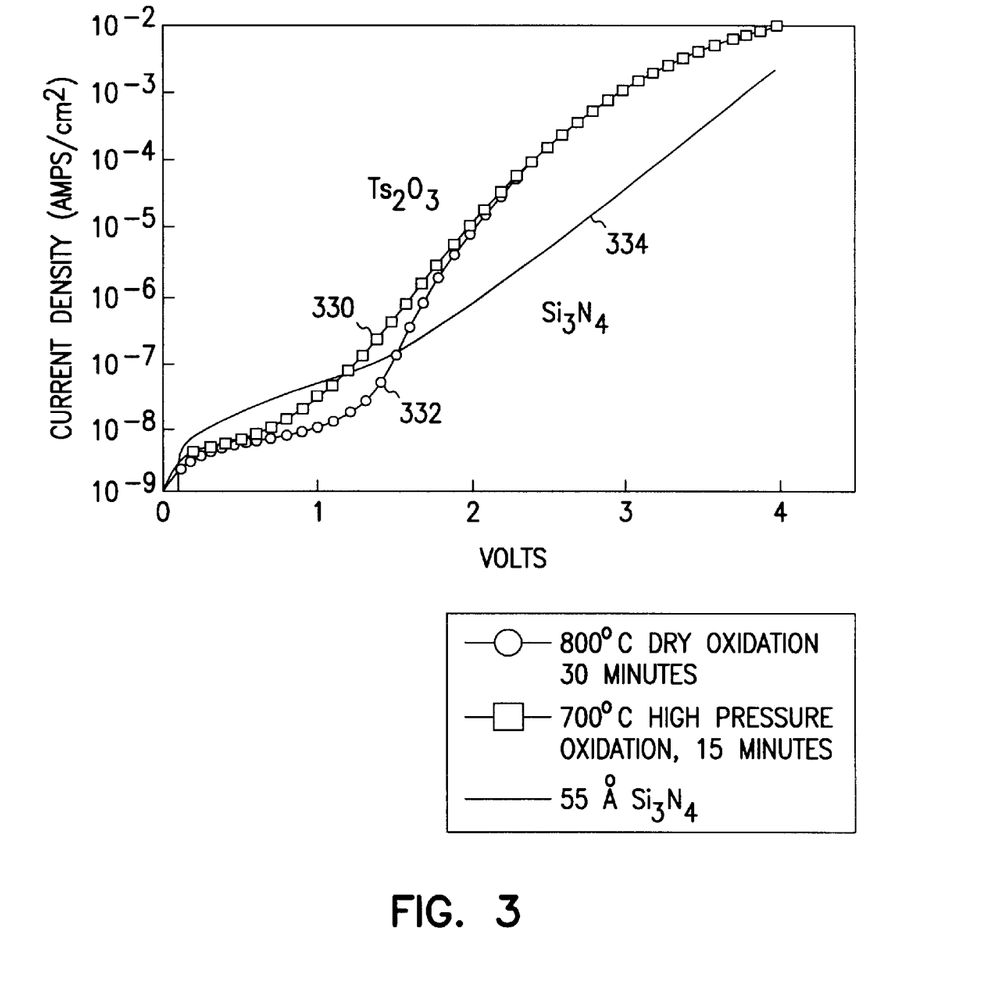
FIG. 3 is a graphical representation of current density versus applied voltage for tantalum penta oxide capacitive dielectric films formed according to the method of the invention compared to conventional silicon nitride capacitive dielectric films.
Figure 4:
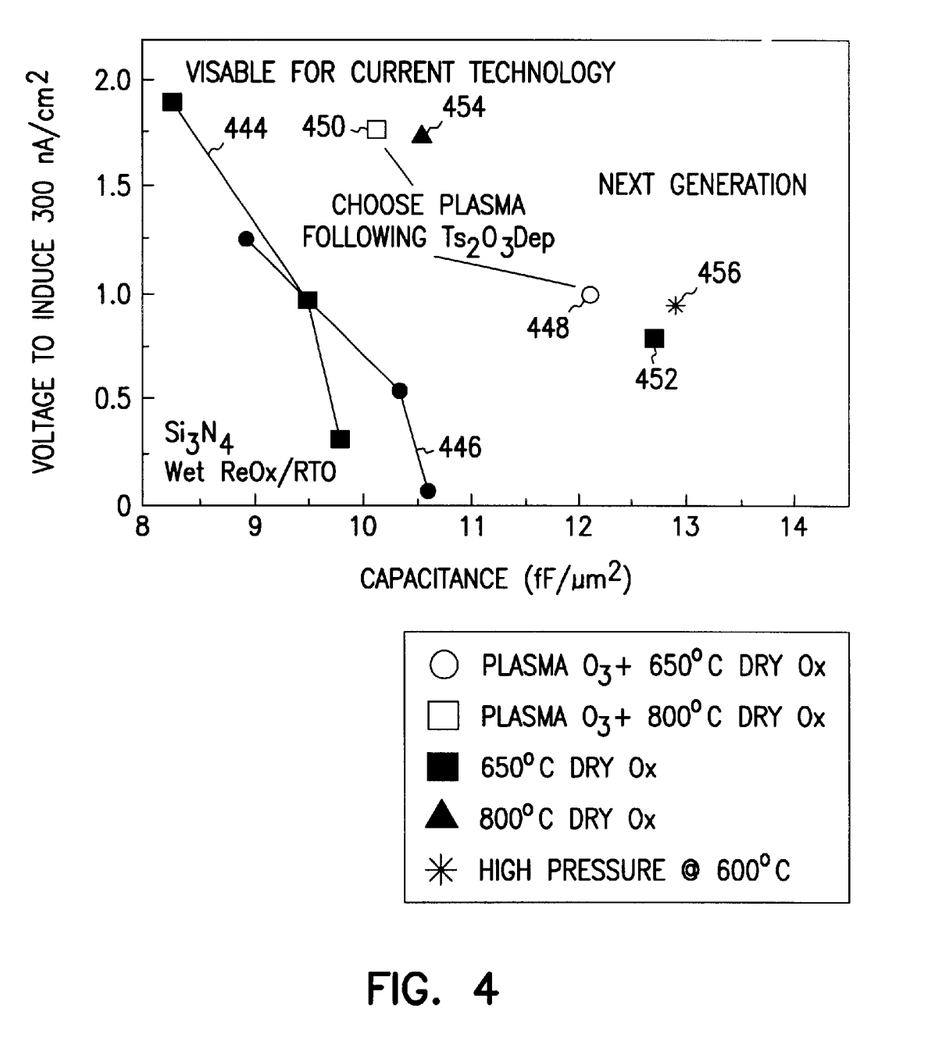
FIG. 4 is a graphical representation of voltage to induce versus capacitance for planar tantalum penta oxide capacitive dielectric films formed according to the method of the invention compared to conventional silicon nitride capacitive dielectric films.
Figure 5:
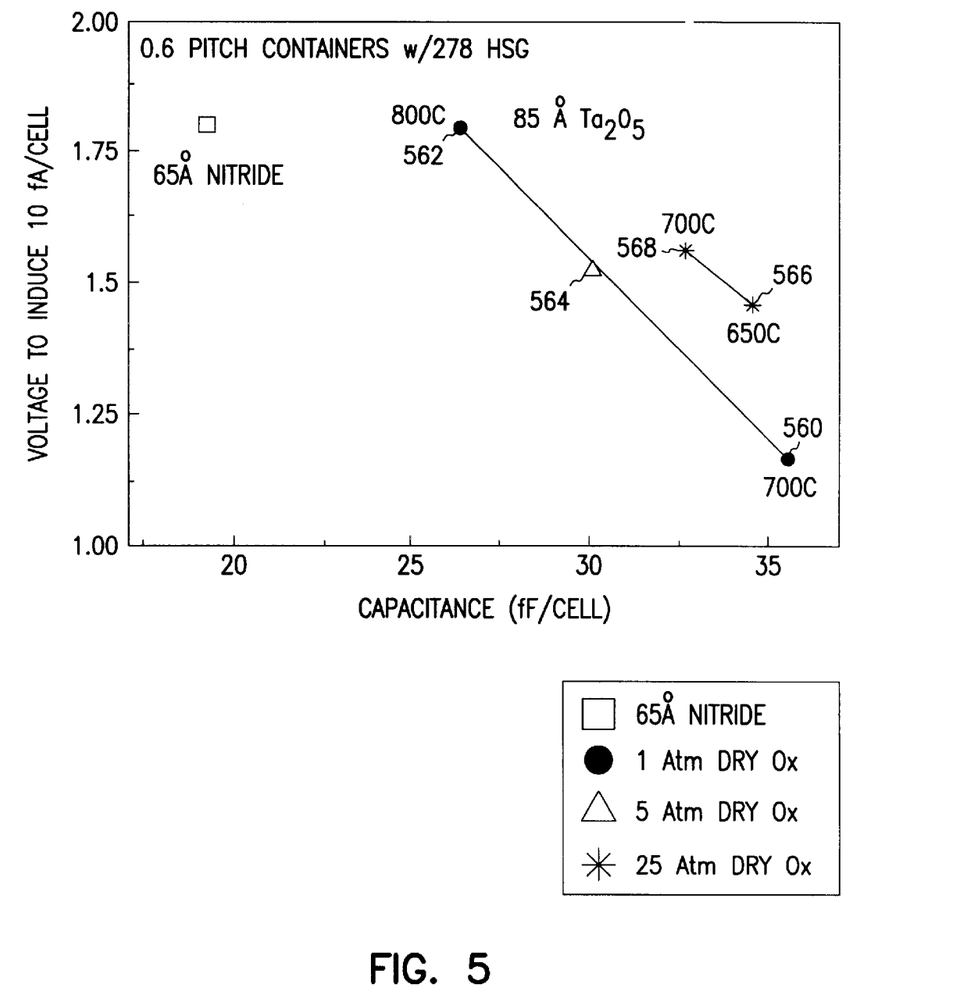
FIG. 5 is a graphical representation of voltage to induce versus capacitance for tantalum penta oxide capacitive dielectric films in 0.6 pitch DRAM containers, varying as a result of the pressure utilized during the densifying/conditioning step of the present invention.

The advantages of using this invention are illustrated with respect to $Ta_2O_5$ in FIGS. 3 to 5. Furthermore, FIG. 1H illustrates the importance of using relatively high pressures of this invention when forming HDC materials, as previously recited. FIG. 3 is a graphical representation of current density versus applied voltage for $Ta_2O_5$ capacitive dielectric films formed according to the method of the invention, as compared to conventional silicon nitride capacitive dielectric films. The $Ta_2O_5$ dielectric capacitive films were formed at a relatively high pressure of 25 atmospheres. $Ta_2O_5$ dielectric capacitive films exhibit reduced low-voltage dielectric tunneling currents. Line 330 illustrates the results for a $Ta_2O_5$ film densified/conditioned in a dry oxygen ambient at 700 degrees Celsius for approximately 15 minutes. Line 332 illustrates the results for a $Ta_2O_5$ film densified/conditioned in a dry oxygen ambient at 800 degrees Celsius for approximately 30 minutes. Line 334 illustrates the results for a conventional silicon nitride capacitive dielectric film.

FIG. 4 is a graphical representation of voltage to induce 300 nA/cm$^2$ versus capacitance (fF/$\mu$m$^2$) for 85 angstrom planar $Ta_2O_5$ capacitive dielectric films formed according to the method of the invention, as compared to conventional silicon nitride capacitive dielectric films, represented by lines 444 and 446. Line 444 illustrates results for a conventional silicon nitride film, treated using dry oxidation at 650 degrees Celsius. Line 446 illustrates results for a conventional silicon nitride film, treated using wet oxidation in a rapid thermal oxidation (RTO) environment. Point 448 illustrates results for a $Ta_2O_5$ capacitive dielectric film treated in an ozone plasma ambient and further treated in a dry oxidation ambient at 650 degrees Celsius. Point 450 illustrates results for a $Ta_2O_5$ capacitive dielectric film treated in an ozone plasma ambient and further treated in a dry oxidation ambient at 800 degrees Celsius. Point 452 illustrates results for a $Ta_2O_5$ capacitive dielectric film treated in a dry oxidation ambient at 650 degrees Celsius. Point 454 illustrates results for a $Ta_2O_5$ capacitive dielectric film treated in a dry oxidation ambient at 800 degrees Celsius. Point 456 illustrates results for a $Ta_2O_5$ capacitive dielectric film densified/conditioned using relatively high pressures of the present invention at 600 degrees Celsius. As can be seen from the increased capacitance per unit area at point 456, for a given voltage, the relatively high pressure surface treatments of the present invention are critical to the formation of high density DRAMs.

FIG. 5 is a graphical representation of voltage to induce 10 fA/cell versus capacitance (fF/cell) for 85 angstrom $Ta_2O_5$ capacitive dielectric films in 0.6 pitch DRAM containers with a hemispherical grain polysilicon bottom plate electrode, varying as a result of the pressure utilized during the densifying/conditioning step of the present invention. Point 558 is illustrated for comparison to a conventional 65 angstrom silicon nitride capacitive dielectric film. Point 560 illustrates the results for a $Ta_2O_5$ capacitive dielectric film densified/conditioned using one atmosphere pressure dry oxidation and 700 degrees Celsius. Point 562 illustrates the results for a $Ta_2O_5$ capacitive dielectric film densified/conditioned using 1 atmosphere dry oxidation and 800 degrees Celsius. Point 564 illustrates the results for a $Ta_2O_5$, capacitive dielectric film densified/conditioned using 5 atmosphere dry oxidation and 700 degrees Celsius. Point 566 illustrates the results for a $Ta_2O_5$ capacitive dielectric film densified/conditioned using 25 atmosphere dry oxidation and 650 degrees Celsius. Point 568 illustrates the results for a $Ta_2O_5$ capacitive dielectric film densified/conditioned using 25 atmosphere dry oxidation and 700 degrees Celsius. As can be seen from FIG. 5, for a given voltage, the relatively high pressure surface treatments of the present invention are critical to the formation of high density DRAMs. As the densification/conditioning pressure increases, advantageous results are even more pronounced.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for fabricating a capacitor structure on a supporting substrate in a processing chamber, comprising the steps of:

forming a bottom plate electrode on the supporting substrate wherein the bottom plate electrode comprises a material selected from the group consisting of: tungsten, tungsten nitride, titanium, titanium nitride, platinum, platinum-aluminum, rhodium, rhodium oxide, cesium oxide, and strontium rhodium oxide (SRO);

forming a high dielectric constant capacitive dielectric film on the bottom plate electrode;

densifying or conditioning the high dielectric constant capacitive dielectric film by performing a nitridation step followed by an oxidation step utilizing a pressure of at least approximately one atmosphere; and forming a top plate electrode on the high dielectric constant capacitive dielectric film.

2. The method of claim 1, wherein the bottom plate electrode is formed by sputtering.

3. The method of claim 1, wherein the bottom plate electrode is formed by chemical vapor deposition.

4. The method of claim 1, wherein the bottom plate electrode has a shape selected from the group consisting of: planar, fin-type, stacked-type, and trenched-type.

5. The method of claim 1, wherein the bottom plate electrode has a topography selected from the group consisting of single-sided, double-sided, and roughened bottom plate electrodes produced using hemispherical grain polysilicon.

6. The method of claim 1, wherein the processing chamber is a batch-type processing chamber, operated at a pressure of up to approximately 100 atmospheres.

7. The method of claim 6, wherein the processing chamber is operated at a pressure of approximately 1 to 25 atmospheres.

8. The method of claim 1, wherein the processing chamber is a single wafer processing chamber, operated at a pressure of at least approximately one atmosphere.

9. The method of claim 8, wherein the processing chamber is operated at a pressure of approximately 25 to 600 atmospheres.

10. The method of claim 1, wherein the high dielectric constant capacitive dielectric film has a dielectric constant of at least approximately 7.

11. The method of claim 1, wherein the high dielectric constant capacitive dielectric film is selected from the group consisting of: tantalum penta oxide ($Ta_2O_5$), yttria ($Y_2O_3$), titanium oxide ($TiO_2$), strontium bismuth titanate (SBT), lead zirconate titanate (PZT), lanthanum-doped lead zirconate titanate (PLZT), barium strontium titanate (BST), bismuth titanate (BiTO), strontium titanate (STO), barium titanate (BaTO), and polymeric materials.

12. The method of claim 1, wherein the high dielectric constant capacitive dielectric film is selected from the group consisting of: tantalum penta oxide ($Ta_2O_5$), yttria ($Y_2O_3$), titanium oxide ($TiO_2$), and has a thickness of at least approximately 30 angstroms.

13. The method of claim 1, wherein the high dielectric constant capacitive dielectric film is selected from the group consisting of: strontium bismuth titanate (SBT), lead zirconate titanate (PZT), lanthanum-doped lead zirconate titanate (PLZT), barium strontium titanate (BST), bismuth titanate (BiTO), strontium titanate (STO), and barium titanate (BaTO), and has a thickness of at least approximately 100 angstroms.

14. The method of claim 1, wherein the oxidation utilizes an ambient selected from the group consisting of $O_2$, NO, and $N_2O$.

15. The method of claim 1, wherein the oxidation utilizes a temperature of at least approximately 200 degrees Celsius.

16. The method of claim 1, wherein the nitridation utilizes a gas selected from the following group consisting of ammonia and hydrazine.

17. The method of claim 1, further comprising an anneal between the step of forming the high dielectric constant capacitive dielectric film and densifying or conditioning the high dielectric constant capacitive dielectric film.

18. The method of claim 17, wherein the anneal is selected from the group consisting of a sub-atmospheric pressure anneal and an ultraviolet-assisted rapid thermal processing anneal.

19. The method of claim 1, further comprising an anneal between the step of forming the high dielectric constant capacitive dielectric film and forming the top plate electrode.

20. The method of claim 19, wherein the anneal is selected from the group consisting of a sub-atmospheric pressure anneal and an ultraviolet-assisted rapid thermal processing anneal.

21. The method of claim 1, further comprising a cleaning step after the densifying or conditioning step, wherein the high dielectric constant capacitive dielectric film is cleaned.

22. The method of claim 21, wherein the cleaning step utilizes a halogen gas.

23. The method of claim 21, wherein the cleaning step utilizes ammonia.

24. A method for fabricating a capacitor structure on a supporting substrate, comprising the steps of:

forming a bottom plate electrode on the supporting substrate;

forming a diffusion barrier layer on the bottom plate electrode utilizing a pressure of at least approximately one atmosphere;

forming a high dielectric constant capacitive dielectric film on the bottom plate electrode;

densifying or conditioning the high dielectric constant capacitive dielectric film utilizing a pressure of at least approximately one atmosphere; and forming a top plate electrode on the high dielectric constant capacitive dielectric film.

25. The method of claim 24, wherein the bottom plate electrode comprises a material selected from the group consisting of: polysilicon, crystalline silicon, hemispherical grain polysilicon, germanium, and silicon-germanium.

26. The method of claim 24, wherein the bottom plate electrode is doped.

27. The method of claim 24, wherein the bottom plate electrode has a shape selected from the group consisting of: planar, fin-type, stacked-type, and trenched-type.

28. The method of claim 24, wherein the bottom plate electrode has a topography selected from the group consisting of single-sided, double-sided, and roughened bottom plate electrodes produced using hemispherical grain polysilicon.

29. The method of claim 24, wherein the processing chamber is a batch-type processing chamber, operated at a pressure of up to approximately 100 atmospheres.

30. The method of claim 29, wherein the processing chamber is operated at a pressure of approximately 1 to 25 atmospheres.

31. The method of claim 24, wherein the processing chamber is a single wafer processing chamber, operated at a pressure of at least approximately one atmosphere.

32. The method of claim 31, wherein the processing chamber is operated at a pressure of approximately 25 to 600 atmospheres.

33. The method of claim 24, wherein the high dielectric constant capacitive dielectric film has a dielectric constant of at least approximately 7.

34. The method of claim 24, wherein the high dielectric constant capacitive dielectric film is selected from the group consisting of: tantalum penta oxide ($Ta_2O_5$), yttria ($Y_2O_3$), titanium oxide ($TiO_2$), strontium bismuth titanate (SBT), lead zirconate titanate (PZT), lanthanum-doped lead zirconate titanate (PLZT), barium strontium titanate (BST), bismuth titanate (BiTO), strontium titanate (STO), barium titanate (BaTO), and polymeric materials.

35. The method of claim 24, wherein the high dielectric constant capacitive dielectric film is selected from the group consisting of: tantalum penta oxide ($Ta_2O_5$), yttria ($Y_2O_3$), titanium oxide ($TiO_2$), and has a thickness of at approximately at least 30 angstroms.

36. The method of claim 24, wherein the high dielectric constant capacitive dielectric film is selected from the group consisting of: strontium bismuth titanate (SBT), lead zirconate titanate (PZT), lanthanum-doped lead zirconate titanate (PLZT), barium strontium titanate (BST), bismuth titanate (BiTO), strontium titanate (STO), and barium titanate (BaTO), and has a thickness of approximately at least 100 angstroms.

37. The method of claim 24, wherein the step of forming a diffusion barrier layer comprises rapid thermal nitridation.

38. The method of claim 37, wherein the rapid thermal nitridation utilizes a gas selected from the group consisting of ammonia and hydrazine.

39. The method of claim 24, wherein the step of forming a diffusion barrier layer and the densifying or conditioning step comprise oxidation.

40. The method of claim 39, wherein the oxidation utilizes an ambient selected from the group consisting of $O_2$, NO, and $N_2O$.

41. The method of claim 39, wherein the oxidation utilizes a temperature of approximately at least 200 degrees Celsius.

42. The method of claim 39, wherein the densifying or conditioning step further comprises nitridation prior to oxidation.

43. The method of claim 42, wherein the nitridation utilizes a gas selected from the group consisting of ammonia and hydrazine.

44. The method of claim 24, further comprising an anneal between the step of forming the high dielectric constant capacitive dielectric film and densifying or conditioning the high dielectric constant capacitive dielectric film.

45. The method of claim 44, wherein the anneal is selected from the group consisting of a sub-atmospheric pressure anneal and an ultraviolet-assisted rapid thermal processing anneal.

46. The method of claim 24, further comprising an anneal between the step of forming the high dielectric constant capacitive dielectric film and forming the top plate electrode.

47. The method of claim 46, wherein the anneal is selected from the group consisting of a sub-atmospheric pressure anneal and an ultraviolet-assisted rapid thermal processing anneal.

48. The method of claim 24, further comprising a cleaning step after forming the diffusion barrier layer, wherein the diffusion barrier layer is cleaned.

49. The method of claim 48, wherein the cleaning step utilizes a halogen gas.

50. The method of claim 48, wherein the cleaning step utilizes ammonia.

51. The method of claim 24, further comprising a cleaning step after the densifying or conditioning step, wherein the high dielectric constant capacitive dielectric film is cleaned.

* * * * *